United States Patent
Usenko (10) Patent No.: US 6,861,320 B1
(45) Date of Patent: Mar. 1, 2005

(54) METHOD OF MAKING STARTING MATERIAL FOR CHIP FABRICATION COMPRISING A BURIED SILICON NITRIDE LAYER

(75) Inventor: Alexander Usenko, Murray Hill, NJ (US)

(73) Assignee: Silicon Wafer Technologies, Inc., Newark, NJ (US)

( * ) Notice: Subject to any disclaimer, the term of this patent is extended or adjusted under 35 U.S.C. 154(b) by 20 days.

(21) Appl. No.: 10/406,868

(22) Filed: Apr. 4, 2003

(51) Int. Cl.⁷ ............................................. H01L 21/336
(52) U.S. Cl. ...................... 438/305; 438/181; 438/308; 438/439; 438/449; 438/510; 438/514; 438/515; 438/526; 438/528; 438/530
(58) Field of Search ................................. 438/181, 305, 438/308, 439, 449, 510, 514, 515, 526, 528, 530

(56) References Cited

U.S. PATENT DOCUMENTS

| | | | |
|---|---|---|---|
| 3,622,382 A | | 11/1971 | Brack |
| 4,113,515 A | * | 9/1978 | Kooi et al. ................. 438/287 |
| 4,522,886 A | * | 6/1985 | Chin et al. ................. 428/446 |
| 4,597,165 A | * | 7/1986 | Capasso et al. ................ 438/23 |
| 4,601,779 A | * | 7/1986 | Abernathey et al. ........ 438/459 |
| 4,762,728 A | * | 8/1988 | Keyser et al. ............... 438/437 |
| 4,866,498 A | * | 9/1989 | Myers ........................ 257/297 |
| 4,975,126 A | * | 12/1990 | Margail et al. ............. 148/33.2 |
| 5,397,720 A | * | 3/1995 | Kwong et al. ............... 438/301 |
| 5,436,175 A | * | 7/1995 | Nakato et al. .............. 438/766 |
| 5,468,657 A | * | 11/1995 | Hsu ............................ 438/766 |
| 5,872,387 A | * | 2/1999 | Lyding et al. ............... 257/607 |
| 5,972,765 A | * | 10/1999 | Clark et al. ................. 438/308 |
| 6,023,093 A | | 2/2000 | Gregor |
| 6,147,014 A | * | 11/2000 | Lyding et al. .............. 438/798 |
| 6,208,002 B1 | * | 3/2001 | Satake et al. ............... 257/410 |
| 6,444,533 B1 | * | 9/2002 | Lyding et al. .............. 438/308 |
| 6,514,825 B1 | * | 2/2003 | D'Souza et al. ............ 438/287 |
| 6,624,052 B2 | * | 9/2003 | Ramkumar et al. ......... 438/530 |
| 6,770,501 B2 | * | 8/2004 | Burnham et al. ............. 438/38 |
| 6,774,462 B2 | * | 8/2004 | Tanaka et al. .............. 257/639 |
| 2002/0047169 A1 | * | 4/2002 | Kunikiyo .................... 257/410 |
| 2003/0219950 A1 | * | 11/2003 | Lyding et al. .............. 438/301 |

OTHER PUBLICATIONS

"SIMOX" by Julian Blake in Encyclopedia of Physical Science and Technology, 3rd edition, vol. 14, pp. 805–813, Academic Press, 2002.

Katsutoshi Izumi "Historical overview of SIMOX", Vacuum, 42 (1991) pp. 333–340.

Jean–Pierre Colinge, "Silicon–on–Insulator Technology: Materials to VLSI", 2nd edition, Kluwer Academic Publishers, 1997, pp. 45–56.

V. S. Kaushik, A. K. Datye, D. L. Kendall, B. Martinez–Tovar, D. S. Simons, D. R. Myers, "Kinetics of silicon nitride crystallization in N + –implanted silicon", Journal of Materials Research 1989 vol. 4 pp. 394–398.

(List continued on next page.)

*Primary Examiner*—Richard Elms
*Assistant Examiner*—Michael K. Luhrs (57) ABSTRACT

The invention provides a method of making silicon-on-insulator SOI substrates with nitride buried insulator layer by implantation of molecular deuterated ammonia ions $ND_3^+$, instead of implanting nitrogen ions ($N^+$, or $N_2^+$) as is done in prior art nitride SOI processes. The resultant structure, after annealing, has a buried insulator with a defect density which is substantially lower than in prior art nitride SOI. The deuterated nitride SOI substrates allow much better heat dissipation than SOI with a silicon dioxide buried insulator. These substrates can be used for manufacturing of high speed and high power dissipation monolithic integrated circuits.

3 Claims, 6 Drawing Sheets

---

201 Implanting ions of deuterated ammonia into the crystal silicon body through the major surface such that a buried nitrogen- and deuterium- rich layer is formed in the silicon body, with a silicon overlayer thereon

↓

202 Heat treating the silicon body in deuterium ambient such that the buried deuterated silicon nitride layer is formed from the nitrogen- and deuterium- rich layer and crystallinity of the silicon overlayer is restored

OTHER PUBLICATIONS

I. Yamada, J. Matsuo, N. Toyoda, A. Kirkpatrick, "Materials Processing by Gas Cluster Beams", Materials Sci. and Engrg. Reports, vol. 34, (2001), pp. 231–295.

K. Volz, W. Ensinger, "Growth of the carbide, nitride and oxide of silicon by plasma immersionion implantation", Surface and Coatings Technology, v. 156 (2002) pp. 237–243.

J.B. Liu, S.S.K. Iyer, J. Min, P.K. Chu, R. Gronsky, C. Hu and N.W. Chueng, "Synthesis of Buried Oxide by Plasma Implantation with Oxygen and Water Plasma", Proceedings 1995 IEEE International SOI Conference pp 166–167.

J. Chen, X. Wang, M. Chen, Z. Zheng, and Y. Yu, "Formation of Silicon on Insulator Using Separation by Implantation", Applied Physics Letters, v. 78, 2001, pp. 73–75.

V.I. Belyi "Silicon Nitride in Electronics", Elsevier Science, 1988, p. 231.

T. Ito, T. Nozaki, H. Arakawa, and M. Shinoda, "Thermally grown silicon nitride films for high–performance MNS devices", Appl. Phys. Lett., 1978 vol. 32, pp. 330–331.

\* cited by examiner

Fig.1

201 Implanting ions of deuterated ammonia into the crystal silicon body through the major surface such that a buried nitrogen- and deuterium- rich layer is formed in the silicon body, with a silicon overlayer thereon

202 Heat treating the silicon body in deuterium ambient such that the buried deuterated silicon nitride layer is formed from the nitrogen- and deuterium- rich layer and crystallinity of the silicon overlayer is restored

601 Implanting ions of nitrogen and hydrogen isotope ions sequentially or simultaneously into the crystal silicon body through the major surface such that a buried nitrogen- and deuterium- rich layer is formed in the silicon body, with a silicon overlayer thereon

602 Heat treating the silicon body in hydrogen isotope ambient such that the buried hydrogenated silicon nitride layer is formed from the nitrogen- and deuterium- rich layer and crystallinity of the silicon overlayer is restored

Fig.6

METHOD OF MAKING STARTING MATERIAL FOR CHIP FABRICATION COMPRISING A BURIED SILICON NITRIDE LAYER

FIELD OF THE INVENTION

The present invention relates generally to a fabrication method for silicon on-insulator (SOI) wafers. More particularly the present invention relates to a fabrication of the SOI with a deuterated silicon nitride insulative layer.

BACKGROUND OF THE INVENTION

Silicon-on-insulator (SOI) wafers are convenient starting material for semiconductor device (chip) fabrication. While the chips can be fabricated on bulk single crystal silicon, the use of the SOI gives advantages of better electrical insulation between individual devices (transistors), extended scaling down capabilities, and better performance of final chips. Two main process technologies for fabrication of SOI are known in prior art, (1) layer transfer, and (2) separation-by-implanted-specie.

The layer transfer consists of the following process steps:
(1) a fragile plane inside of a donor wafer is created; the plane defines the boundary of a layer to be transferred;
(2) an insulator layer is grown on a surface of a handle wafer;
(3) the donor and the handle wafers are initially bonded constituting a wafer assembly;
(4) the donor wafer in the assembly is cleaved along the fragile plane to form an SOI wafer and a leftover portion of the donor wafer;
(5) the initial bonding in the SOI wafer is strengthened.

The separation-by-implanted-specie process consists of the following major steps:
(1) ion implantation 101 FIG. 1 of a specie 102 into a silicon wafer 103 creating a buried layer 104 where the specie 102 is mixed with a target material such as semiconductor silicon;
(2) creating a buried insulator layer 105 from the mix layer 104; the implanted specie 102 is chemically active to silicon and can be caused to self organize into a continuous layer of a silicon-specie compound 105.

An advantage of the separation-by-implanted-specie over the layer transfer is process simplicity. It includes 2 processing steps while the layer transfer includes 5 steps.

There is only one version of separation-by-implanted-specie known in prior art that has gained major industrial applications. This is separation by implanted oxygen (SIMOX), described an article "SIMOX" by Julian Blake in Encyclopedia of Physical Science and Technology, 3rd edition, volume 14, pp.805–813, Academic Press, 2002. The implanted oxygen forms an amorphous stoichiometric silicon dioxide $SiO_2$ buried layer inside of the silicon wafer. SIMOX wafers have quality that allowed using them as a starting wafer in commercial chip fabrication.

$SiO_2$ serves acceptably well as an electrical insulator. However, $SiO_2$ is also a thermal insulator. This undesirable thermal resistivity is a main disadvantage of the SIMOX material. Attempts were made in the prior art to create SOI with improved thermal conductivity while keeping simultaneously electrical insulation quality comparable to that of $SiO_2$. Since $SiO_2$ has an extremely low thermal conductivity of 0.014 W/m/K almost any replacement of $SiO_2$ will improve SOI thermal performance.

Implanting of nitrogen was used in the prior art for the first time in the mid 1960s with a purpose to create SO with a silicon nitride layer inside, see Katsutoshi Izumi "Historical overview of SIMOX", Vacuum, 42 (1991) pages 333–340. A continuous silicon nitride layer was formed; but its quality was not good enough to fabricate chips on these wafers. The process was called SIMNI. A first patent issued for this process for fabricating a single crystalline semiconductor body with a subsurface insulating layer comprising silicon nitride was issued in 1971, Brack U.S. Pat. No. 3,622,382. Since that time attempts to improve quality of the nitride insulator layer to a level enabling chip fabrication on these wafers have not been successful, see for example a book by Jean-Pierre Colinge, "Silicon-on-Insulator Technology: Materials to VLSI", $2^{nd}$ edition, Kluwer Academic Publishers, 1997, pp.45–56.

Quality of the buried insulator layer created by the SIMNI process is limited because of the following:
(1) nitrogen bubbles appear in the middle of the buried insulator layer
(2) high leakage currents through the buried insulator layer
(3) high interface states density occurs at the silicon—buried insulator interfaces.

Causes for the listed above detrimental features of SOI with $Si_3N_4$ formed with the SIMNI process are the following:
(1) nitrogen has low diffusivity in stoichiometric silicon nitride $Si_3N_4$;
(2) $Si_3N_4$ tends to crystallize at temperatures exceeding 800° C.

Here we describe in more detail why the low diffusivity and crystallization of $Si_3N_4$ prevents fabrication of high quality SOI with the SIMNI process. The low nitrogen diffusivity in stoichiometric silicon nitride $Si_3N_4$ further limits the thickness of the continuous $Si_3N_4$ layer that can be formed. If a plain silicon wafer is thermally nitridized (i.e, annealed in nitrogen ambient), nitrogen first chemically reacts with surface silicon atoms thus starting a $Si_3N_4$ layer. Further growth of the $Si_3N_4$ layer is limited by the diffusion of nitrogen through the already grown $Si_3N_4$ layer toward silicon—$Si_3N_4$ interface. The maximum thickness of $Si_3N_4$ that can be thermally grown is about 30 Å which is too thin for most foundry processes. To obtain this maximum thickness, nitridation should be performed at the highest possible temperatures (i.e., approaching silicon melting temperature). By comparison, the maximum thickness of a surface $SiO_2$ layer obtained by thermal oxidation is about 1 micrometer. This is 300 times thicker. The $SiO_2$ thickness limited by the same phenomenon: diffusion of a reactant through a grown compound, i.e., oxygen through $SiO_2$. Creating a buried insulator layer from a mix during the second step of either SIMM or SIMOX is similar to the processes of thermal nitridation and oxidation in that both processes are limited by diffusion of the implanted specie through the already grown silicon compound. Finally, the maximum thickness of a silicon compound layer obtained by thermal treatment is the same for both cases: for the surface, and for the internal silicide formation. That means that we cannot expect to get a high quality buried $Si_3N_4$ layer thicker, than 2×30 Å=60 Å. The factor 2 appears because the nitride grows in 2 directions, toward bulk, and toward surface of the wafer. This consideration gives us a criterion for choosing nitrogen implantation dose in SIMNI. To obtain less than 60 Å $Si_3N_4$ layer, nitrogen implantation dose should not exceed $10^{17}$ cm$^{-2}$ for N+ implantation, or $5 \times 10^{16}$ cm$^{-2}$ for $N_2$+ implantation. Attempts to use this low dose are known in prior art. They, however, resulted in creation of $Si_3N_4$ islands inside of silicon instead of getting a continuous $Si_3N_4$ layer. The reason is that the implanted specie (nitrogen here) is distributed along a depth in the target due to a random character of stopping of ions in the solid. The depth distribution of the implanted species is characterized phenomenon known as vertical struggling. This struggling depends on masses of atoms of target lattice and implanted specie, and on the energy of implantation. In the case of nitrogen implanted into silicon, the struggling is about 250 Å at lowest reasonable energy of implantation (20 keV) and it increases with implantation energy reaching 1500 Å at 800 keV. Energy that is lower than 20 keV cannot be used because in an SOI process it results in a surface nitride layer instead of the desirable buried layer. One can expect to obtain a continuous buried layer even in the case when the final thickness of the internally grown layer is much less than the struggling lengths. It requires collecting of the distributed implanted specie in and near a single defined plane inside of the wafer. This phenomenon is observed for some cases (for example, for hydrogen implanted into silicon, and for oxygen implanted into silicon). Hydrogen and oxygen collects at a plane of maximum vacancy-type defects in silicon. However, the nitrogen implanted into silicon does not show this self confining feature. Success of SIMOX can be thus explained by the (1) $SiO_2$ layer thickness exceeding struggling, and (2) self-confinement of the struggled implanted oxygen toward $SiO_2$ layer nucleated at vacancy peak.

Another feature of $Si_3N_4$ is that it is prone to an amorphous-to-crystalline transition at quite low temperatures starting from 800° C., see for example V. S. Kaushik, A. K Datye, D. L. Kendall, B. Martinez-Tovar, D. S. Simons, D. R. Myers, "Kinetics of silicon nitride crystallization in N+-implanted silicon", Journal of Materials Research, 1989, Vol. 4, pp. 394–398. By comparison, amorphous $SiO_2$ starts to crystallize at much higher temperatures ~1500° C. To transform the nitrogen/silicon mix into $Si_3N_4$, however, a temperature exceeding 1200° C. is required, as explained above. Therefore the nitride SOI obtained with SIMNI has the buried insulator layer consisting from polycrystalline $Si_3N_4$. The polycrystalline layer has high current leakage along its crystal grain boundaries. It does not show desirable electrical insulative properties.

Attempts to form SiC, AlN, $AM_2O_3$ and other SOI with separation-by-implanted-species are known in the prior art. These attempts have been even less successful than with SIMNI and did not result in creation of a desirable continuous buried insulator layer.

Silicon nitride has thermal conductivity of about 0.3 W/m/K while silicon dioxide has thermal conductivity 20× lower of 0.014 W/m/K. Attempts were made in prior art as to make SOI with oxynitride $SiN_xO_y$ buried layers. This process called SIMON (see above cited Colinge book) results in a thermal conductivity of the oxynitrides close to that of $SiO_2$. SIMON does not present advantages in thermal performance of SOI.

Hydrogenated silicon nitrides do however have a thermal conductivity approaching that of amorphous stoichiometric silicon nitride, i.e., 0.3 W/m/K. The art would therefore benefit from an improved method for hydrogenated nitride SOI fabrication.

SUMMARY OF THE INVENTION

It is an object of the present invention to provide a simple process for fabrication of silicon-on-insulator wafers with a thermally conductive buried insulator layer.

It is a further object of the invention to provide a process for fabrication of silicon-on-insulator wafers having a stable hydrogenated silicon nitride buried insulator layer.

According to the present invention, a method for making of an SOI for further chip fabrication comprises steps of:
(1) ion implantation of deuterated ammonia $ND_3$ into a silicon wafer at energy in a range 20 to 800 keV and a dose in a range $5 \times 10^{16}$ to $4-10^{18}$ cm$^{-2}$. The wafer is kept at temperature 400 to 600° C. during the implantation.
(2) annealing of the implanted wafer in deuterium at temperature in a range 900 to 1300° C.

At the step (1) a buried mix layer containing deuterium, nitrogen, and silicon is created. Ions of deuterated ammonia $ND_3^+$ divide into individual nitrogen and deuterons upon hitting the silicon surface and they penetrate into the silicon, and come to a rest with a projection range $R_p$. The $R_p$ of deuterium is almost equal to that of the nitrogen. It further allows creating $SiN_x$:D layer before deuterium out diffuses from the wafer.

At the second step (2), a continuous buried insulator layer is formed from the mix layer; the buried insulator layer comprises deuterated silicon nitride. Deuterium ambient in $2^{nd}$ step of the process prevents premature deuterium losses (dehydrogenation) from the mix layer. The dehydrogenation results in lowering of diffusivity of the mix components, especially diffusivity of nitrogen through the layer. It further results in the capturing of excessive nitrogen in the middle of the layer and creating of nitrogen gas bubbles inside of the layer. The bubbles are undesirable in the final SOI. Also, the excessively dehydrogenated silicon nitride prematurely transforms from amorphous to polycrystalline state that is also undesirable in the SOI. The deuterium ambient in the $2^{nd}$ step of the process also prevents depassivation of interface states on silicon-buried insulator interfaces. The resulting SOI has low density of interface states on these interfaces. Also, the deuterium ambient in the $2^{nd}$ step of the process promotes a physical flattening of a surface of the SOI wafer. A deuterated forming gas ambient can be successfully used instead of pure deuterium.

DETAILED DESCRIPTION OF THE FIRST PREFERRED EMBODIMENT

This invention allows one to fabricate SOI wafers with reduced thermal resistance between a single crystal silicon overlayer and the SOI substrate as compared to the SOI wafers fabricated using conventional processes.

An embodiment, which will now be described, shows a method for making an SOI wafer with a deuterated silicon nitride buried dielectric layer.

Figure 1:
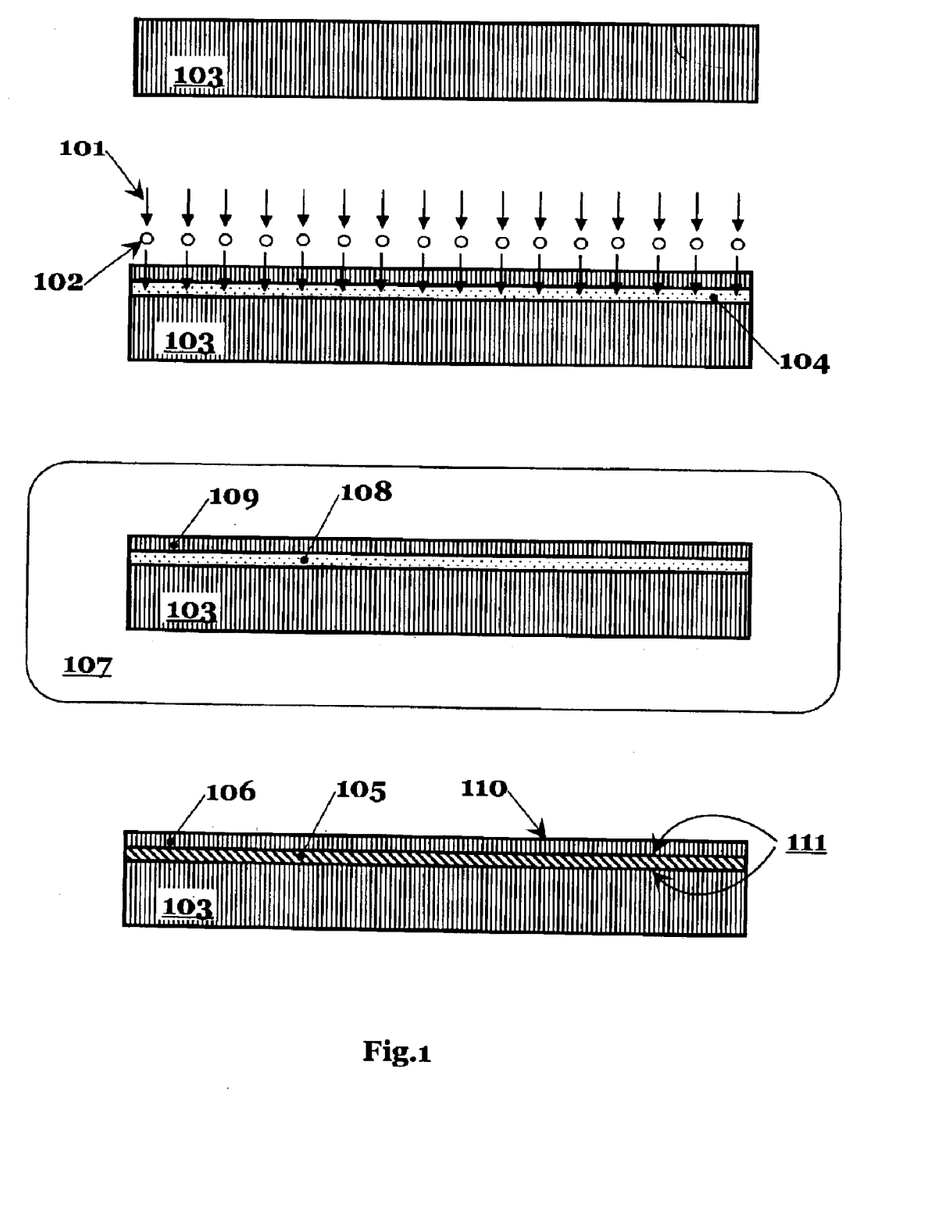
FIG. 1 is a schematic sectional views illustrating process flow steps for manufacturing a SOI substrate using separation by an implanted specie.
Figure 2:
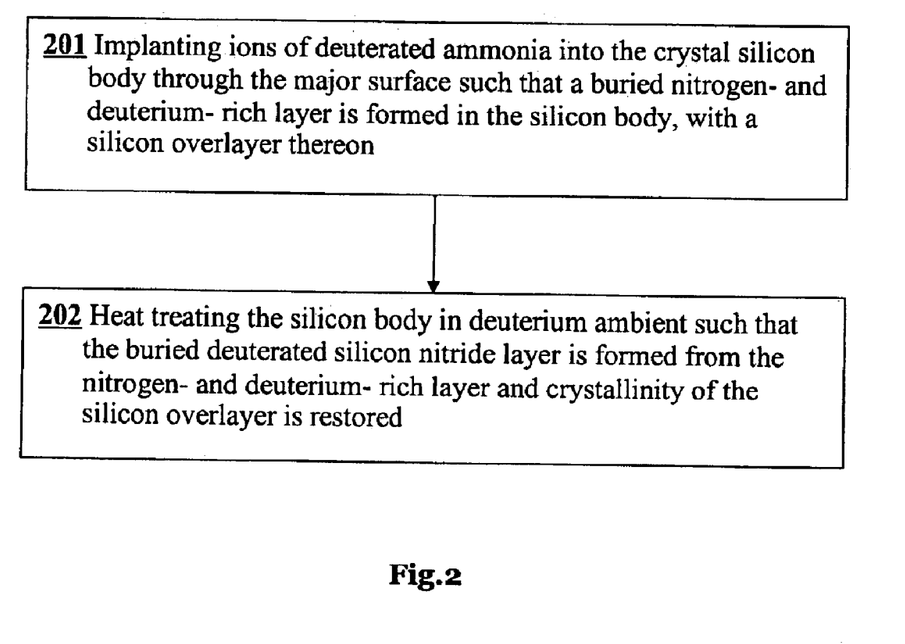
FIG. 2 shows the inventive process sequence due to the first preferred embodiment.

The process flow is illustrated by FIG. 1 and FIG. 2. An initial silicon wafer 103 is a standard bare silicon wafer preferably having <100> crystallographic orientation of main surface. The wafer 103 is first implanted with molecular ions of deuterated ammonia $ND_3$ at step 201 of the process.

Implantation energy at step 201 is chosen in a range from 20 keV to 800 keV. Increasing the implantation energy results in the creation of a thicker silicon overlayer. If the energy is near the bottom of the range, the expected thickness of the overlayer is less than 100 nm. Using of energy lower than 20 keV results typically either in a deuterated silicon nitride layer that is not buried, but lies on a surface of the final structure, or it results in a completely amorphized silicon overlayer. The completely amorphized silicon overlayer does not include a continuous single crystalline seed plane, and therefore it cannot not be converted back into a single crystalline silicon overlayer by solid state epitaxy during the second step of the SOI process. If the energy is near the top of the range (800 keV), the thickness of the overlayer is about 1 micrometer. Higher than indicated energy can be possibly used provided that high voltage and high current implanters are available. However, the maximum energy should be lower than a threshold of photonuclear reactions (the lowest photonuclear threshold energy is 1.7 MeV for colliding deuterium and beryllium). Exceeding this threshold causes transmutations of colliding elements. New elements created are often unstable isotopes that cause an undesirable ionizing radiation. An energy required to obtain a desired thickness of the overlayer can be obtained by one skilled in the art using a computer simulation program SRIM. SRIM allows simulating of projected ranges for the implanted ions. The projected range for nitrogen is the center of the buried insulator layer to be formed.

A dose of the implantation at step 201 is chosen in a range from $5 \times 10^{16}$ to $4 \times 10^{18}$ cm$^{-2}$. The minimum dose is required to obtain a continuous buried insulator layer. This minimum dose of $5 \times 10^{16}$ cm$^{-2}$ allows forming a continuous layer If implantation energy is equal to 20 keV. A thin buried insulator layer is created in this case having a thickness of about 20 Å. Further decreasing of the dose causes creation of islands of deuterated silicon nitride in silicon. For higher implantation energies, the minimum required dose is higher, reaching about $2 \times 101^7$ cm$^2$ for energies near the upper limit of the recommended range. Exceeding of the top dose in the range causes creation of the buried insulator layer having nitrogen bubbles in the middle. Additionally, for implantation energies near the bottom of the recommended range, the maximum dose should be limited to $10^{18}$ cm$^{-2}$. An increasing of the dose causes an increased thickness of the buried insulator and a decreased the thickness of the silicon overlayer. The combination low energy and high dose reduces the thickness of the silicon overlayer to zero, and SOI is not obtained.

The wafer 103 should be kept at temperatures in a range 400 to 600° C. during the implantation. The elevated temperature is required for enhanced self annealing of atomic displacements in silicon overlayer that are caused by implanted specie. If the temperature is lower than 400° C., the silicon overlayer is completely amorphized before the required implantation dose is reached. As it is explained above, the complete amorphization of the silicon overlayer leads to failure of the SOI process. The structure obtained in such a process consists of handle substrate, buried insulator, and amorphous overlayer. This structure is not useful. Process temperatures over the recommended value cause excessive outdiffusion of deuterium from the wafer during the implantation process. The resulting structure is similar to one obtained by nitrogen implantation, and therefore has a low quality about equal to the quality of SINMI wafers.

The SIMOX process also uses an elevated wafer temperature exceeding 500° C. Nitrogen is has slightly lower atomic mass compared to oxygen. Therefore it introduces less damage into silicon. Temperature with nitrogen that is enough to prevent amorphization is slightly lower.

The process of ion implantation 201 with compound molecular ions is technically more complicated than ion implantation of atomic ion species, or molecular compounds of the same specie as $H_2^+$, $H_2^{++}$, $O_2^+$, $O_2^{++}$, $N_2^+$, $N_2^{++}$. Special care should be taken while choosing a proper ion source, magnetic separation, etc. However, the technique of the compound molecular ion implantation has been developed in prior art. For example, this technique is widely used for decaborane implantation and for $BF_2^+$ implantation. One skilled in the art can perform properly the compound molecular ion implantation following explanations available for example in I. Yamada, J. Matsuo, N. Toyoda, A. Kirkpatrick, "Materials Processing by Gas Cluster Beams", Materials Sci. and Engrg. Reports, Vol.34, (2001) pp.231–295.

Figure 3:
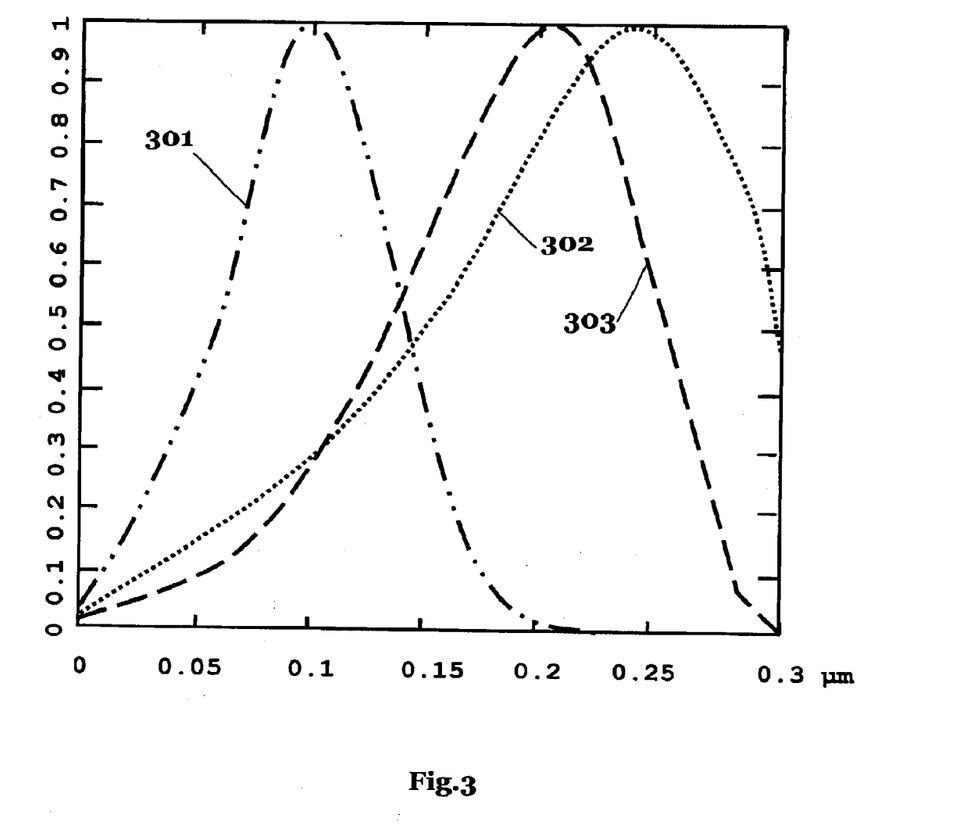
FIG. 3 shows the depth distribution of protium, deuterium, and nitrogen if they are implanted into a silicon wafer in form of ammonia (at 85 keV) or deuterated ammonia (at 100 keV).
Figure 4:
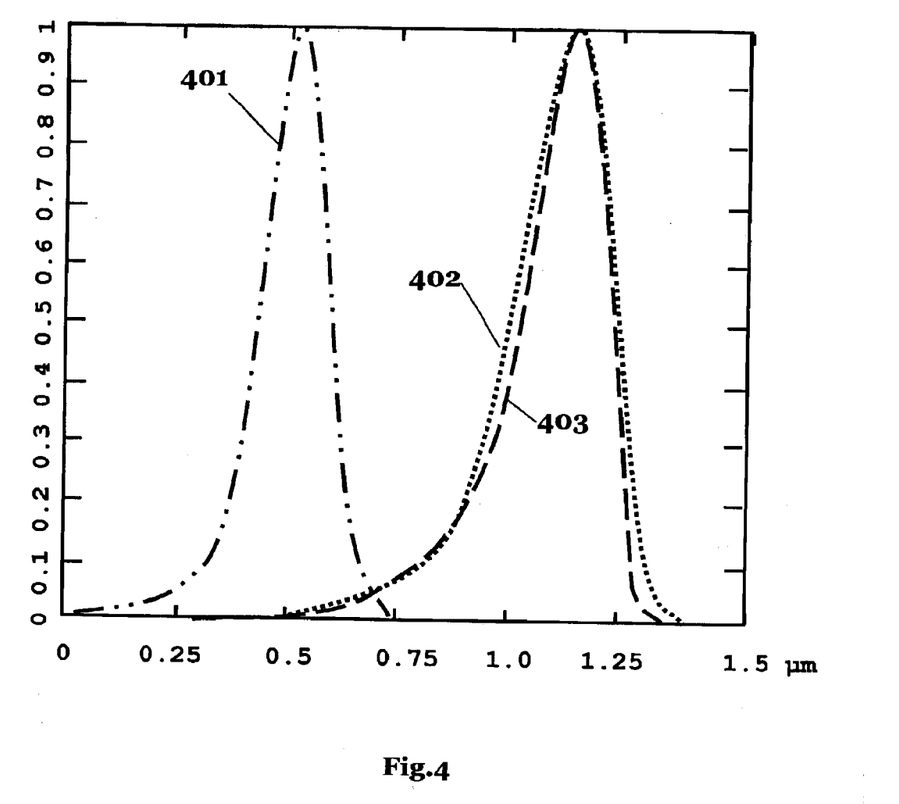
FIG. 4 shows the depth distribution of protium, deuterium, and nitrogen if they are implanted into a silicon wafer in form of ammonia (at 850 keV) or deuterated ammonia (at 1 MeV).
Figure 5:
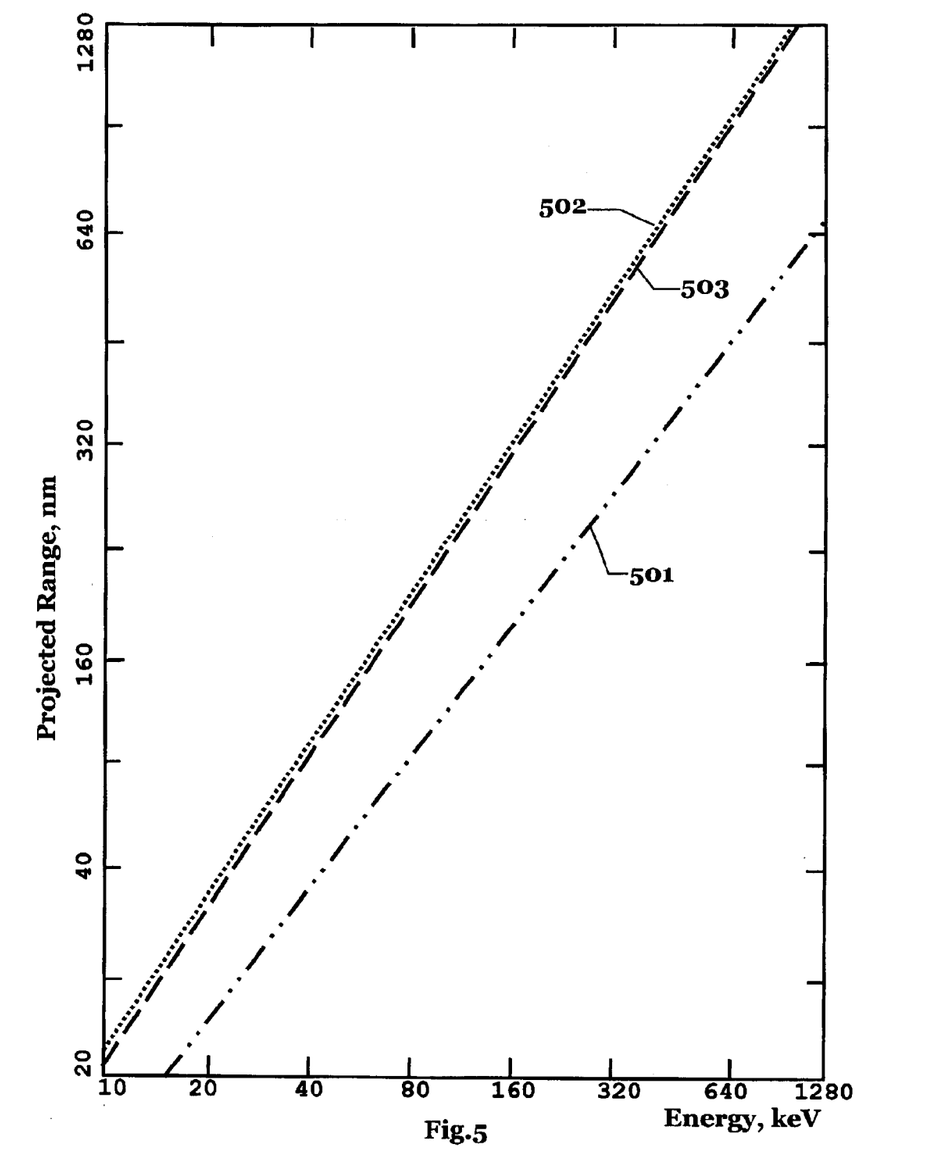
FIG. 5 shows plots of projected ranges for nitrogen, deuterium, and protium as a function of implantation energy for implanted $ND_3$ or $NH_3$ ions.

The implanted molecular compound divides into individual atoms that penetrate into the silicon lattice, loose their energy and speed, and stop at a depth (projection range). An initial energy of the molecular ion divides between its components proportionally to their masses. For example, implantation of ammonia ion $NH_3^+$ having an energy 85 keV is equal to a simultaneous implantation of nitrogen (atomic mass 14) having an energy 70 keV and protium hydrogen (atomic mass 1) having an energy 5 keV. FIG. 3 shows depth distribution of the implanted ions. The projected ranges are depths corresponding to the peaks in the FIG. 3, where a curve 301 is protium distribution and 303 is nitrogen distribution obtained after implantation of ammonia $NH_3$ at 85 keV. The 14× ratio of energy for the nitrogen and protium results in a projection range which is twice that of protium, 1761 Å and 958 Å restively. The components of the implanted ammonia $NH_3$ compound stops at different depth; they are separated by a silicon layer, and therefore they do not chemically interact. Consequently, if ammonia $NH_3$ implanted silicon wafer is further annealed, the protium hydrogen outdiffuses from the wafer, and the nitrogen behaves similarly as in a case of simple nitrogen implantation, see for example K. Volz, W. Ensinger, "Growth of the carbide, nitride and oxide of silicon by plasma immersion ion implantation", Surface and Coatings Technology, v. 156 (2002) pp.237×243. Resulting wafer is similar to the wafer obtained in a SIMNI process, i.e., low quality wafer. An increasing of implantation energy of $NH_3$ causes increasing of $R_p$ of both nitrogen, and protium hydrogen Curves 401 and 403 on FIG. 4 are distributions of protium hydrogen and nitrogen after implantation of ammonia $NH_3$ at high energy (850 keV). A wide gap between $R_p$ of protium and nitrogen (0.5249 μm, and 1.12 μm respectively) is observed. The ~2× difference in $R_p$ of H and N exists at all energies, as illustrated by FIG. 5, where 501 is a plot of $R_p$ of protium, and 503 is $R_p$ of nitrogen for $NH_3$ implantation at energies ranging film 10 to 1000 keV. Therefore overlapping protium hydrogen and nitrogen layers cannot be obtained by ammonia implantation. It is possible to make overlapping hydrogen and nitrogen profiles by sequentional or simultaneous implantation from two ion sources by choosing proper energies for H and N. This process is described in the second preferred embodiment.

If deuterated ammonia $ND_3$ is implanted, the initial energy of the compound molecule distributes between component atoms in the ratio 7:1 as atomic masses of nitrogen and deuterium are 14 and 2, respectively. It causes almost coinciding depth distribution of nitrogen and deuterium in silicon, see curves 302 (deuterium) and 303 (nitrogen) on FIG. 3 after implantation of $ND_3$ into Si at energy 100 keV.

This is equal to simultaneous implantation of nitrogen at 70 keV and 3 deuteriums at 10 keV each. Projected ranges are 1781 and 2059 Å for N and D respectively. At higher energy, both nitrogen and deuterium distributions shifts deeper, FIG. 4 shows D 402 and N 403 distributions after $ND_3$ implantation at 1 MeV. Projected ranges are 1.12 and 1.13 μm for N and D respectively. The deuterium and nitrogen distributions almost coincide in wide energy range of $ND_3$ implantation, from 10 keV to 1 MeV as it is illustrated by FIG. 5, where 502 is projected range for deuterium, and 503 is projected range for nitrogen.

Coinciding distributions of deuterium and nitrogen allows further formation of highly deuterated silicon nitride. The deuterated silicon nitride is characterized by much higher diffusion coefficient of nitrogen as compared to diffusion of nitrogen in stoichiometric $Si_3N_4$. This allows forming buried layers of deuterated silicon nitride from the mix 104 that are thicker than 60 Å without nitrogen bubbles in the middle of the layer.

Another fandamental reason that restricts allowable energies is the ratio of projected range to struggling. An ideal distribution of the implanted specie for further forming of the buried layer is square starting at depth $d_1$ and ending at depth $d_2$ inside of the silicon wafer. Real distributions of implanted species are, however, distorted Gauss curves. The shape of the curve depends on energy of the implanted specie. Lowering of implantation energy causes the curve width (called struggling) approaches the depth of the curve peak (called $R_p$). In this case the buried layer is not created. FIG. 3 shows an implanted species distribution at low energy that is about equal to the minimum possible energy that allows creating of a buried layer. One can compare this distribution with distributions of the same implanted species at high energies, see FIG. 4. It can be seen that the struggling-to-$R_p$ ratio is ~10, and therefore forming of the buried layer is not restricted. Therefore the sub-100 keV value for the deuterated ammonia molecular ion implantation poses the lower limit for the energies. Deuterium has an energy 10 keV in this case, with Rp=2059 Å, and struggling=710 Å, corresponding to a projection range—to struggling ratio of only about 3.

A silicon body obtained by the process 201 contains mix 104 and it is further processed at a step 202 FIG. 2, the step comprises heat treating the silicon body in deuterium ambient at temperatures in a range 900 to 1300° C. such that the buried deuterated silicon nitride layer is 105 formed from the nitrogen- and deuterium-rich layer and crystallinity of the silicon overlayer 106 is restored. A processing furnace contains deuterium gas 107. Layers 108 and 109 represents transient states of the layer ultimately resulting in the overlayer 106, and the buried insulator layer 105.

Thermal processing at temperatures lower than 900° C. during the step 202 results in incomplete annealing of post-implantation defects in the silicon overlayer 106. The high concentration of post-implantation defects in the layer 106 detrimentally affects the electrical quality of the layer. Also annealing temperatures of less than 900° C. at step 202 are not enough to fully transform the mix 104 into uniform $SiN_x$:D layer 105. In this case the layer 105 has a chemical composition that varies across the layer. The electrical quality of the under-annealed layer 105 is low as this layer contains traps for charge carriers in high concentration.

Thermal processing at temperatures higher than 1300° C. during the step 202 results in crystallization of the buried layer 105, an amorphous $SiN_x$:D layer 105 transforms into polycrystalline stoichiometric $Si_3N_4$. As it was mentioned above, the polycrystalline insulator layer is not desirable in the final SOI. Deuterium ambient used in the step 202 slower deuterium losses from the layer 105 during the annealing. The deuterated silicon nitride crystallizes at temperatures exceeding 1300° C. Note that stoichiometric $Si_3N_4$ crystallize at much lower temperature (starting from 800° C.), causing problems in the SIMNI prior art process. The use of deuterated silicon nitride in the inventive process allows overcoming that problem. The crystallization temperature depends significantly on hydrogen content in the silicon nitride. The 800° C. limit relates to hydrogen-free $Si_3N_4$. Initially hydrogen-containing silicon nitride crystallizes at 1150° C. if annealed in hydrogen-free ambient. The 1150° C. is a temperature when hydrogen completely effuses away from the nitride, and then the nitride immediately crystallizes, see V. I. Belyi "Silicon Nitride in Electronics", Elsevier Science, 1988, p.231. The 1150° C. limit ensures that the buried insulator layer will not crystallize during chip fabrication process on that wafer. Initially hydrogen isotope containing silicon nitride crystallizes at temperature exceeding 1300° C. provided that annealing is in hydrogen isotope containing ambient. In this case the nitride does not lose hydrogen, and therefore does not crystallize.

The deuterium ambient in the step 202 serves two more functions. It promotes atomically smoothening of main surface 110 of the final SOI wafer and it preserves a low interface state density $N_{ss}$ on silicon—buried insulator interfaces 111 in the final SOI wafer. Ito et al. found in 1978 that nitridation in ammonia results in low interface state density $10^{10}$ cm$^{-2}$, while nitridation in $N_2$ results in high interface state density exceeding $10^{12}$ cm$^{-2}$ (T. Ito, T. Nozaki, H. Arakawa, and M. Shinoda, "Thermally grown silicon nitride films for high-performance MNS devices", Appl. Phys. Lett., 1978 vol.32, pp. 330–331.). This result can be interpreted that the silicon-nitride interface requires passivation species (hydrogen isotope) to keep the low interface state density. This explains why the deuterium-annealed SOI due to inventive process has much lower $N_{ss}$ than SIMNI wafers. Without the deuterium ambient the top silicon surface 110 has craters remaining after hitting by $ND_3$ molecular ions during the step 201; the craters are not desirable in the SOI wafers. All 3 functions mentioned (preserving deuteration, surface smoothing, and surface state passivation) are affectively performed in the temperature range 900 to 1300° C. Mixing of deuterium with neutral gas as argon or nitrogen does not affect on results of annealing. However, the deuterium/nitrogen or deuterium/argon mixtures containing about 10% of deuterium are preferable to use in mass production as they does not endanger process safety.

Hydrogen role as "diffusion enhancer" can be evidenced by data from prior art. For example, J. B. Liu, S. S. K. Iyer, J. Min, P. K. Chu, R. Gronsky, C. Hu and N. W. Chueng, "Synthesis of Buried Oxide by Plasma Implantation with Oxygen and Water Plasma", Proceedings 1995 IEEE International SOI Conference, pp. 166–167, and also later J. Chen, X. Wang, M. Chen, Z. Zheng, and Y. Yu, "Formation of Silicon on Insulator Using Separation by Implantation", Applied Physics Letters, V. 78, 2001, pp.73–75 study fabrication of SOI by molecular ion implantation of hydrogen-containing compound. They implant water $H_2O$ using plasma immersion implanter. They experimentally found that the buried insulator layer formed by $H_2O^+$ implantation is much thicker than the buried insulators obtained by $O_2^+$ implantation. Even though the layer thickening was surprising for them and they do not suggest any hypothesis to explain this phenomenon, their data are consistent with our results in forming a buried nitride layer from a hydrogen containing mix. In all cases, hydrogen containing mixes are characterized by higher diffusion coefficient of their components in the either silicon oxide or silicon nitride layer being formed. While for the oxide layer it does not make an important difference (high quality $SiO_2$ layer can be formed even without hydrogen), for the nitride layer (having extremely low 30 Å thickness limit for non-hydrogenated silicon nitride) it does make a crucial difference allowing fabricating high quality nitride layers from depth distributed implanted mixes.

Detailed Description of the Second Preferred Embodiment

Figure 6:
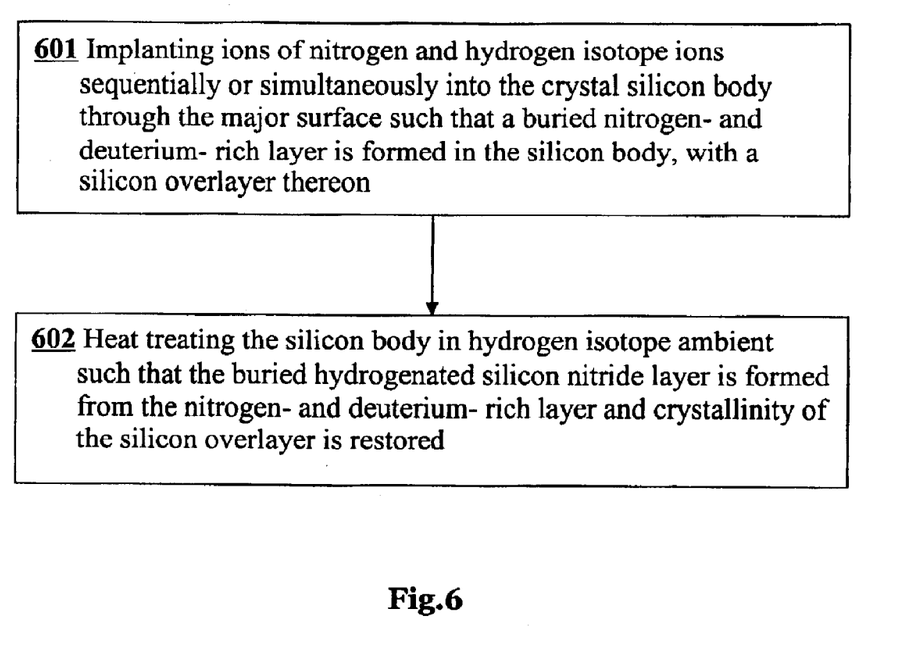
FIG. 6 shows the inventive process sequence for to the second preferred embodiment

The embodiment which now is described differs from the previous embodiment by initial processing step 601 FIG. 6. The final processing step 602 is similar to the step 202 in the first preferred embodiment, and will not be described here.

The step 601 comprises either sequential or simultaneous implantation of nitrogen and hydrogen into initial silicon wafer 103. In a case of sequential implantation, the nitrogen should be implanted first, followed by hydrogen implantation. Energies of hydrogen and nitrogen are chosen to obtain overlapping distributions of the implanted species in silicon. Therefore the ratio of energies $E_H/E_N$ is chosen in a range 5 to 7. The hydrogen can be used either in form of protium or in form of deuterium. The acceptable range for energies for hydrogen is 5 to 100 keV, and the range of energies for nitrogen is 35 to 500 keV.

If simultaneous implantation of both species is used, the doses for nitrogen are in the same range, as doses for $ND_3$ described in the first preferred embodiment. The doses for hydrogen depend on nitrogen doses and should satisfy a ratio $D_H/D_N$ in a range 1 to 4. The wafer temperature during simultaneous implantation should be in a range 400 to 500° C.

If sequential implantation is used, the range is narrower, from $2$–$10^{17}$ to $10^{18}$ cm$^{-2}$ for nitrogen. It finally results in narrower range of available thicknesses for the buried insulator layer. The temperature during nitrogen implantation is in a range 400 to 600° C. The dose of hydrogen implantation should exceed the dose for the nitrogen implantation. Temperature during hydrogen implantation should be in a range 100 to 300° C.

Sequential implantation has an advantage that standard implantation equipment can be used. However, sequential implantation restricts available thicknesses on the buried insulator layer, and quality of the final SOI wafers. Simultaneous implantation has an advantage for SOI wafer diversity and quality, but requires a specialized implanter with two ion sources, two magnetic separators, and two beam lines both directed to a single end station.

Annealing step 602 can be performed either in deuterium containing ambient, or in protium hydrogen containing ambient. In the latter case the final SOI wafers have however lower quality as related to stability of silicon—buried insulator interface. Chips made on these wafers are more prone to hot electron effects. It happens because the interface states initially passivated by protium hydrogen can be depassivated by hot charge carriers. To retain immunity to hot carrier effects, SOI wafers obtained by the inventive process with deuterium be thermally processed with deuterium gas in the chip foundry (see, for example, in U.S. Pat. No. 6,023,093 awarded to Gregor and Kizilialli).

It is to be understood that the above-described embodiments are merely illustrative of the invention and that many variations may be devised by those skilled in the art without departing from the scope of the invention and from the principles disclosed herein. It is therefore intended that such variations be included within the scope of the following claims and their equivalents.

What is claimed is:

1. A method of making an article comprising a layer of silicon nitride buried within a silicon body, the method comprising;
    (a) providing a single crystal silicon body having a major surface and a crystal orientation;
    (b) implanting ions into the silicon body through the major surface such that a buried nitrogen-rich layer is formed in the silicon body, with a silicon overlayer thereon;
    (c) heat treating the implanted silicon body in an ambient such that the buried insulative layer is formed from the nitrogen-rich layer;
    (d) completing making the article;
    CHARACTERIZED IN THAT
    (e) the implanted ions are deuterated ammonia ions
    (f) the ambient for the heat treating is a deuterium and nitrogen gas mixture
    (g) the buried layer is a deuterated silicon nitride layer.

2. A method of making an article comprising a layer of silicon nitride buried within a silicon body, the method comprising;
    (a) providing a single crystal silicon body having a major surface and a crystal orientation;
    (b) implanting ions into the silicon body through the major surface such that a buried nitrogen-rich layer is formed in the silicon body, with a silicon overlayer thereon;
    (c) heat treating the implanted silicon body in an ambient such that the buried insulative layer is formed from the nitrogen-rich layer;
    (d) completing making the article;
    CHARACTERIZED IN THAT
    (e) the implanted ions are nitrogen and hydrogen isotope ions
    (f) nitrogen is implanted first followed by hydrogen isotope ion implantation
    (g) implantation energy for nitrogen is 5 to 7 times higher than that for a hydrogen isotope ion
    (h) the ambient for the heat treating is a hydrogen isotope and nitrogen gas mixture
    (i) the buried layer is a deuterated silicon nitride layer.

3. A method of making an article comprising a layer of silicon nitride buried within a silicon body, the method comprising;
    (a) providing a single crystal silicon body having a major surface and a crystal orientation;
    (b) implanting ions into the silicon body through the major surface such that a buried nitrogen-rich layer is formed in the silicon body, with a silicon overlayer thereon;
    (c) heat treating the implanted silicon body in an ambient such that the buried insulative layer is formed from the nitrogen-rich layer;
    (d) completing making the article;
    CHARACTERIZED IN THAT
    (e) the implanted ions are nitrogen and hydrogen isotope ions
    (f) the nitrogen and hydrogen isotope ions are implanted simultaneously
    (g) implantation energy for nitrogen is 5 to 7 times higher than that for hydrogen isotope ions
    (h) the ambient for the heat treating is hydrogen isotope and nitrogen mixture
    (i) the buried layer is a deuterated silicon nitride layer.

* * * * *